United States Patent [19]

Langenbach

[11] 3,977,749

[45] Aug. 31, 1976

[54] ELECTRONIC PACKAGING ASSEMBLY

[75] Inventor: Jack E. Langenbach, Newport Beach, Calif.

[73] Assignee: International Telephone and Telegraph Corporation, New York, N.Y.

[22] Filed: Jan. 29, 1975

[21] Appl. No.: 545,148

[52] U.S. Cl. .............................. 339/75 M; 312/333; 339/91 R

[51] Int. Cl.² .......................................... H01R 13/54

[58] Field of Search .......... 339/75 R, 75 M, 75 MP, 339/91 R, 92 R, 92 M, 176 R, 176 M; 312/320, 333

[56] References Cited

UNITED STATES PATENTS

| | | | |
|---|---|---|---|
| 2,735,965 | 2/1956 | Balanda | 339/75 M |
| 3,594,698 | 7/1971 | Anhalt | 339/75 M |
| 3,848,222 | 11/1974 | Lightner | 339/75 M |
| 3,853,379 | 12/1974 | Goodman | 339/75 MP |

*Primary Examiner*—Roy Lake
*Assistant Examiner*—Mark S. Bicks
*Attorney, Agent, or Firm*—Thomas L. Peterson

[57] ABSTRACT

An electronic packaging assembly in which a box containing electronic components is slidably mounted on a support and carries at its rear an electrical connector member which engages with a mating electrical connector member mounted at the rear of the support with zero insertion force. Means is provided at the front of the support for moving the contacts mounted at the rear of the support to bring the respective contacts in the two connector halves into engagement. Such means also simultaneously latches the two connector halves together and positively latches the front of the box to prevent it from lifting off of the support.

15 Claims, 8 Drawing Figures

10
12
14
22
24
26
82
116

10
12
14
16
18
20
24
26
36
58
70
76
78
81
84
86
88
90
91
92
94
96
98
100
102
104
106
108
110
114
116
118
120
122
124

12
24
92
116
118
91
102
124
112
81
120
90
88
102
122

12
24

120
118
14
91
112
94
124
122
92
111
114
86
84
81
88
96
90
82

12

90
118
122
88
102
116
91
124
120
112
102
92
24

ELECTRONIC PACKAGING ASSEMBLY

BACKGROUND OF THE INVENTION

This invention relates generally to an electronic packaging assembly including a box and support therefor and, more particularly, to such an assembly in which a connector member on the rear of the box is mated with a connector member at the rear of the support with zero insertion force.

It is common practice in aircraft to mount avionics "black boxes" on shelves with an electrical connector member mounted on the back of each box which engages with a mating connector half mounted on the rear of the shelf when the box is slid fully to the rear of the shelf. The avionics "black box" contains electronic circuitry and components necessary for controlling the various functions of the aircraft. As aircraft avionics become more complex, the number of wires required to connect the box to the aircraft's wiring increases. The forces required to mate the two connector halves of the connector associated with each box now used in these applications is proportional to the number of contacts. For example, a box having approximately 600 contacts has an insertion or mating force of about 200 lbs. It is therefore desirable that a connector be utilized for this application which has a zero insertion force. Connectors of this general type are well known in the art. An example of such a connector is disclosed in U.S. Pat. No. 3,594,698 to Anhalt. A zero insertion force connector contains fixed contacts in one connector half and movable contacts in the second connector half. An actuating plate is provided in such second connector half which, when shifted, moves the movable contacts into electrical engagement with the fixed contacts in the first connector half. Thus, in order to utilize a zero insertion force connector in an aircraft avionics assembly as described hereinabove, there is required some means at the front of the shelf which supports the box to actuate the connector at the rear of the shelf. Further, some means is required to positively latch the box in order to prevent it from lifting off of the shelf. It is the purpose of the present invention to achieve one or more of these objectives.

SUMMARY OF THE INVENTION

According to the principal aspect of the present invention, a box containing electronic components is slidably mounted on a stationary support. A connector member is mounted on the rear of the box. A second connector member containing movable contacts is mounted at the rear of the support. When the box is slid to the rear of the support, the two connector members mate with each other, but the contacts are spaced so that the connector members are mated with essentially zero force. Means including an actuating arm is provided at the front of the support for moving the movable contacts in tandem in the connector member at the rear of the support to engage the contacts in the connector member at the rear of the box. Such contact actuating means also includes means for positively latching the box to prevent the box from lifting off of the support. Thus, the box may be conveniently and easily electrically connected to the wiring in an aircraft from the front of the support for the box and the box is firmly retained on such support simply by movement of a single actuating arm.

DESCRIPTION OF THE PREFERRED EMBODIMENT

Figures 1, 2:
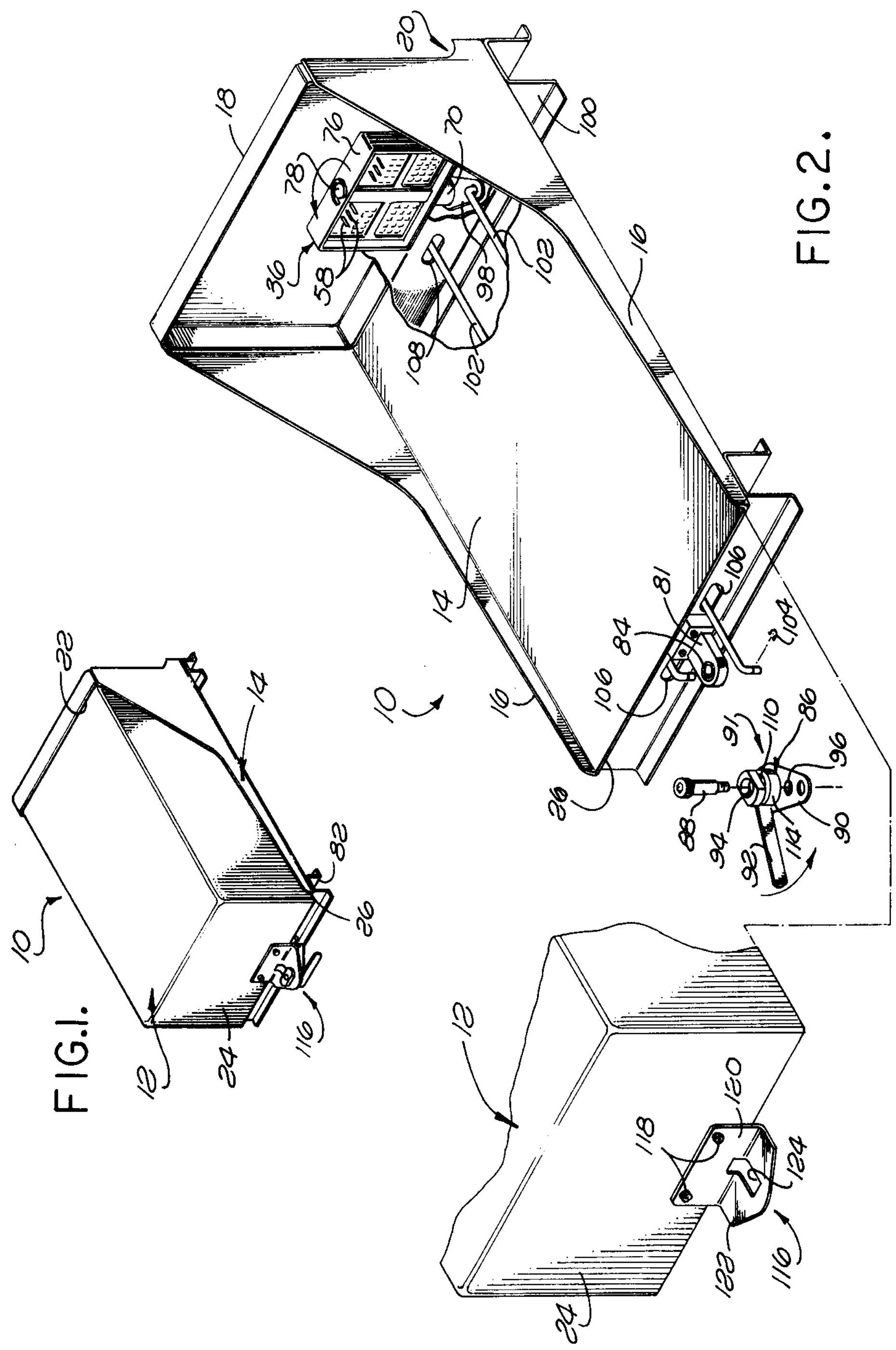
FIG. 1 is a perspective view of the electronic packaging assembly of the present invention showing the box fully mounted on its support.
FIG. 2 is a fragmentary exploded perspective view of the assembly illustrated in FIG. 1.

Referring now to the drawings in detail, there is illustrated the electronic packaging assembly of the present invention, generally designated 10. The assembly comprises an avionics box 12 which is mounted on the upper surface of a flat support or tray 14. The support includes vertical sides 16 for guiding sliding movement of the box on the support. While only a single box and tray have been illustrated, it will be appreciated that most often there will be a number of boxes supported by an elongated shelf in a typical aircraft application. A vertical plate 18 is fixedly mounted at the rear 20 of the support 14. When the box 12 is slid rearwardly on the support 14, the rear wall 22 of the box abuts against the back plate 18 of the support 14 and the front 24 of the box is adjacent to the front 26 of the support.

Figure 3:
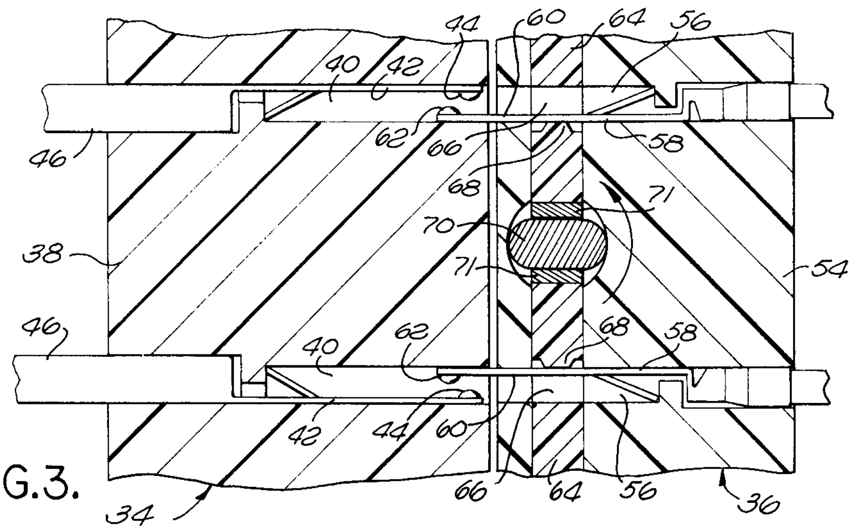
FIG. 3 is a fragmentary partial horizontal section through the two connector members of the assembly shown in their mated position, with the contacts disengaged.
Figure 4:
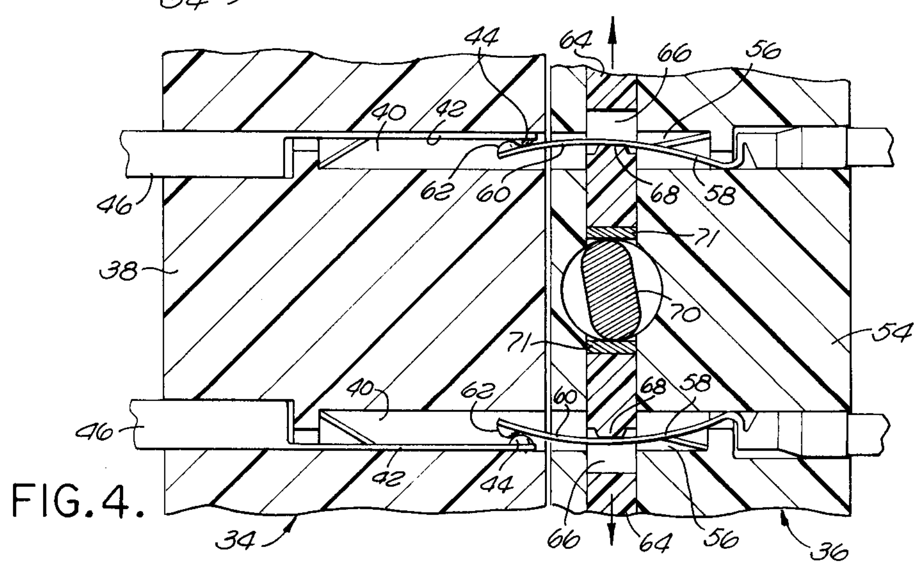
FIG. 4 is similar to FIG. 3 but shows the contacts in their engaged position.
Figure 5:
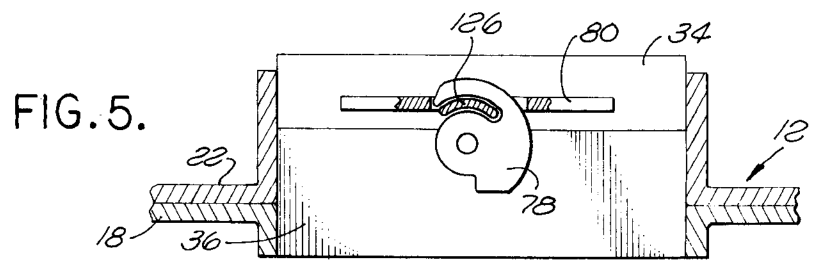
FIG. 5 is a horizontal partial sectional view through the rear of the assembly illustrated in FIG. 1 taken just above the connector and showing the latch which holds the connector members of the connector together.

As seen in FIG. 5, a connector member 34 is mounted in the rear wall 22 of the box aligned with a mating connector member 36 mounted in the rear plate 18 of the support so that the respective contacts in the connector members will be in juxtaposition when the connector members are mated by sliding the box to the rear of the support. As seen in FIGS. 3 and 4, the connector member 34 comprises an insulator 38 formed with a plurality of openings 40 therein, only two being shown in the drawing. Each opening contains an individual contact 42 which is formed with a contacting surface 44 disposed within the opening. Each contact terminates in a terminal portion 46 which may be connected to a wire, not shown, that leads to electronic circuitry in the box. The connector member 36 also comprises an insulator 54 formed with a plurality of openings 56 which are aligned with the openings 40 in the connector member 34 when the connector members are mated. A contact 58 is mounted in each of the openings 56. Each contact 58 includes an elongated beam portion 60 which extends outwardly from the opening 56 and terminates in a contacting surface 62. A pair of insulator plates 64 are slidably mounted in the connector member 36 for movement in a plane which is parallel to the back plate 18 of the support. Each plate is formed with a plurality of spaced apertures 66 through which the contacts 58 extend. A projection 68 is formed on one wall of each of the apertures 66 engaging the beam portion 60 of each contact 58. A cam shaft 70 is mounted for rotation about a vertical axis disposed between the two plates 64. Cam bearings 71 are provided on each of the plates 64 adjacent to the cam shaft.

As seen in FIG. 3, the plates 64 are normally positioned such that the contacting surfaces 44 of the contacts 42 are out of engagement with the contacting surfaces 62 of the contacts 58. However, when the cam shaft 70 is rotated approximately 90°, the plates 64 shift in opposite directions as shown by the arrows in FIG. 4 thereby shifting the contacts 58 in tandem so that the contacting surfaces 44 and 62 of the respective sets of contacts will engage each other with a high unit force of contact. When the cam shaft 70 is returned to its normal position illustrated in FIG. 3, the spring action of the contacts 58 will return the plates 64 to the position shown and the two sets of contacts will disengage. Springs, not shown, may be provided at the opposite ends of the plates 64 urging them toward the cam shaft. For further details of this type of zero insertion force connector, reference may be made to the aforementioned Anhalt patent which illustrates a connector similar to that disclosed herein except that the cam shaft is disposed horizontally rather than vertically.

Referring again to FIG. 2, it is noted that the connector member 36 includes a shell 76. The cam shaft 70 projects beyond the upper and lower walls of the shell 76. A latch member 78 is fixedly mounted to the exposed upper end of the cam shaft. This latch member cooperates with a latch plate 80 mounted on top of the connector member 34 to latch the two connector members together when the cam shaft is rotated to actuate the contacts, as seen in FIG. 5.

The mechanism for actuating the contacts in the connector member 36 will now be described. A bearing block 81 is fixedly mounted to a mounting rail 82 secured to the bottom of the support 14 adjacent to the front 26 thereof. The bearing block 81 contains a sleeve bearing 84. A bushing 86 is rotatably mounted in the sleeve bearing 84 by means of a shoulder screw 88. A bell crank 90 is spaced below the bottom of the bushing 86 a distance slightly greater than the height of the bearing block 81. An actuating arm 92 is welded to the bushing 86 and bell crank 90 thereby providing an integral assembly 91. The bushing has a vertical bore 94 therethrough. To assemble the bell crank assembly 91 to the bearing block 81, the assembly is slid over the front of the block 81 to align the bore 94 with the sleeve bearing 84. Then the shoulder screw 88 is inserted through the bore, and the threaded end of the screw is threaded into a threaded opening 96 in the bell crank aligned with the bore 94. Thus, the bell crank assembly is rotatable about a vertical axis at the front of the support 14 and below the support. A bell crank 98 is also fixed to the bottom of the cam shaft 70 which extends through the support 14 and into a rear mounting rail 100. Links 102 are connected to the ends of the bell cranks 90 and 98 by means of retaining rings 104. The links extend through slots 106 and 108 in the rails 82 and 100, respectively, only one of such of the slots 108 being seen in FIG. 2.

Figure 6:
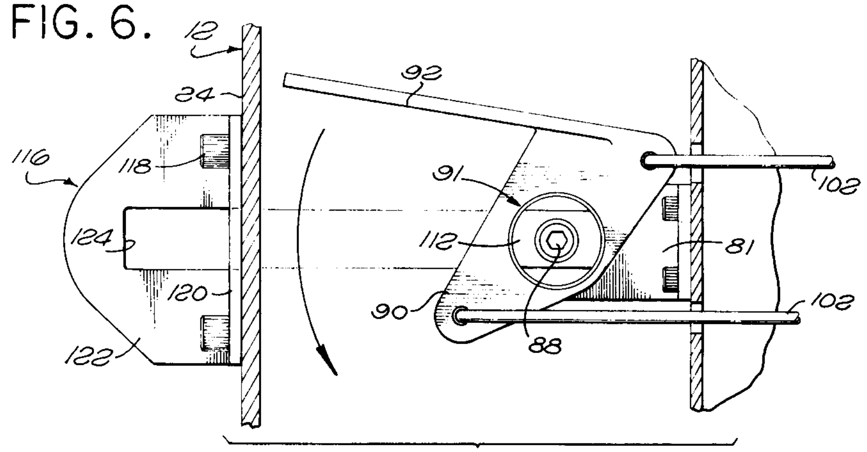
FIG. 6 is a fragmentary exploded horizontal section through the front of the box and support showing the position of the actuating arm of the assembly before the box is fully slid to the rear of the support and before the movable contacts of the connector are actuated.

The bell cranks 90 and 98 are normally positioned as illustrated in FIGS. 2 and 6, wherein the cam shaft 70 affixed to bell crank 98 is positioned as illustrated in FIG. 3 so that the contacts in the respective connector members are out of engagement. When the actuating arm 92 is rotated in the direction indicated by the arrows in FIGS. 2 and 6, the bell crank 90 is rotated, and such rotation is translated by the links 102 to the bell crank 98, causing the cam shaft 70 to rotate in the direction indicated by the arrow in FIG. 3 so that the movable contacts 58 on the back plate 18 of the support come into engagement with the fixed contacts 42 at the rear of the box 12 as seen in FIG. 4.

Figure 7:
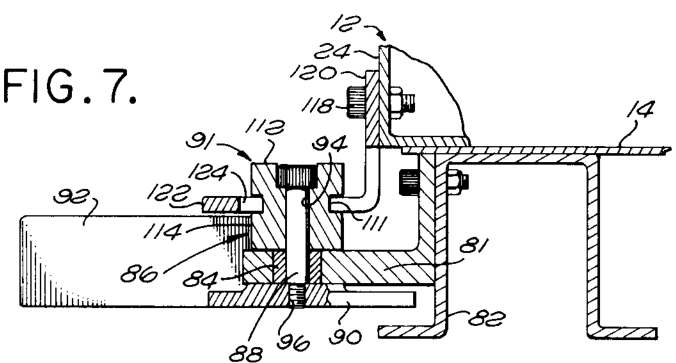
FIG. 7 is a fragmentary vertical sectional view taken through the center of the actuating mechanism at the front of the support and box illustrated in FIG. 1 showing the actuating arm in the same position as illustrated in FIG. 6.

The bushing 86 is formed with an annular groove 110 separating the bushing into an upper part 112 and lower part 114 joined by a neck 111. A latch bracket 116 is fixed to the front 24 of box 12 by means of screws 118. The bracket 116 includes a vertical plate 120 and a horizontal lower plate 122. The lower plate lies in the same plane as the neck 111 of the bushing 86 which is below the support 14. A slot 124 is formed in the bracket 116 and extends into both the upper and lower plates of the bracket so that the slot opens to the rear of the bracket. The height of the portion of the slot 124 in the plate 120 is greater than the height of the upper part 112 of the bushing. The length of the narrow neck portion 111 of the bushing is slightly greater than the thickness of the horizontal plate 122 of the bracket. The upper part 112 of the bushing is elongated and has a length greater than the width of the slot 124. The width of the upper part 112 is less than the width of the slot. Hence, when the box 112 is moved forwardly on the support 14, and when the upper part 112 of the bushing is disposed in the position illustrated in FIGS. 2 and 6, such upper part 112 will pass through the vertical portion of the slot 124 in the plate 120 and the neck 111 of the bushing will enter into the horizontal portion of the slot, as illustrated in FIG. 7. When the actuating arm 92 is rotated in the direction indicated by the arrows in FIGS. 2 and 6, to the position illustrated in FIG. 8, the ends of the upper part 112 of the bushing will overlie the horizontal plate 122 of the latch bracket 116 thereby positively latching the forward end of the box 12 to the front of the support 14. Preferably, the actuating arm 92 is shifted 100° from the position illustrated in FIG. 6 to that illustrated in FIG. 8 to rotate the cam shaft 70 a like amount, hence slightly over center, whereby the cam shaft will not tend to rotate in the reverse direction by the force of the contacts 58.

Figure 8:
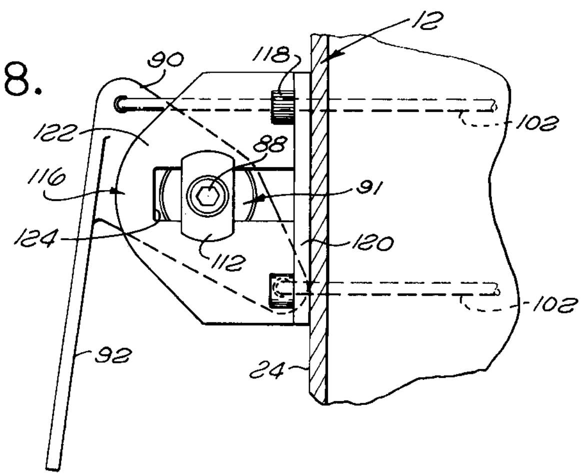
FIG. 8 is a horizontal sectional view similar to FIG. 6 but showing the actuating arm shifted to its fully actuated position wherein the movable contacts in the connector are actuated and the latching mechanism for the front of the box is in operable position.

It is noted that because the upper latching part 112 of the bushing 86 has a length greater than the width of the slot 124, if the arm 92 were positioned as illustrated in FIG. 8, wherein the movable contacts 58 are in their active position, the box 12 cannot be slid horizontally completely to the rear of the support since such movement will be prevented by the bracket 116 striking the latching portion 112 of the bushing. Since it is possible to lift box 12 and latch bracket 116 over bushing 112, the connector member 34 is prevented from mating with connector member 36 when the movable contacts 58 are in their active position by latch member 78 which will then abut the rear of the arcuate portion 126 of latch plate 80. Therefore, this arrangement avoids any possibility of the connector member 34 on the box being mated with the connector member 36 on the support 14 when the movable contacts 58 are in their active position.

In summary, the latching arm 92 is initially positioned as illustrated in FIGS. 2 and 6 in which the upper elongated latching part 112 of the bushing 86 lies in a path perpendicular to the support front 26. In this position of the arm 92 and hence the bell crank 90, the cam shaft 70 in the connector member 36 is positioned as illustrated in FIG. 3 wherein the movable contacts 58 are in their inactive position. The box 12 is then mounted on the support 14 and slid toward the rear 18 to cause the two connector members 34 and 36 to mate. Since the contacts 58 are in their inactive position, they are spaced from the fixed contacts 42 in the connector member 34. Hence, the two connectors members mate with zero insertion force. As the box is moved to its rearward position on the support, the latch bracket 116 slides over the upper part of the bushing 86 since the bushing is properly aligned with the slot 124 in the bracket. Thereafter the actuating arm 92 is rotated in the direction indicated by the arrows in FIGS. 2 and 6 until it reaches the position shown in FIG. 8 wherein the upper portion 112 of the bushing positively latches the bracket 116, preventing the front of the box from lifting off of the support 14. Such rotation of the actuating arm also activates the movable contacts 58 in the connector member 36, in the manner described previously herein, and rotates the latch 78 to the position illustrated in FIG. 5 latching the two connector members 34 and 36 in mated position. Thus, the simple shifting of the actuating arm 92 in one direction serves to simultaneously actuate the connector, and positively latch the front and rear of the box 12 on the support 14 so that it will not lift off of the support. Rotating the actuating arm 92 in the reverse direction from the direction illustrated in FIG. 8 to that illustrated in FIG. 6 automatically inactivates the contacts in the connector member 36, unlatches the two connector members, and releases the front latch for the box 12, thus allowing the box to be slid forwardly off of the support 14.

What is claimed is:

1. An electronic packaging assembly comprising:

a generally flat stationary support having a front and a rear;

a box for containing electonic components slidable on the upper surface of said support from said front, said box having a front and a rear;

said support being void of structure restricting upward lifting of said box off of said upper surface;

a first set of contacts at said rear of said box;

a second set of movable contacts at said rear of said support, said first and second sets of contacts being positioned adjacent to but spaced from each other when said box is slid to said rear of said support; and means including an actuating arm at said front of said support for moving said second set of movable contacts in tandem to engage said first set of contacts, said means including positive latch means cooperating with said box to prevent lifting of said front of said box off of said support surface.

2. An assembly as set forth in claim 1 wherein:

said moving means also includes second latch means, other than said contacts, at said rear of said support cooperating with said box to prevent lifting of said rear of said box off of said support surface.

3. An assembly as set forth in claim 2 wherein;

said moving means simultaneously engages said contacts and operates said positive latch means and said second latch means.

4. An assembly as set forth in claim 1 wherein:

said moving means includes means preventing said box from being slid to said rear of said support when said movable contacts are positioned by said moving means to engage said first set of contacts.

5. An assembly as set forth in claim 1 wherein said moving means includes:

means mounting said actuating arm for rotation about a vertical axis;

a cam shaft adjacent to said movable contacts mounted for rotation about a second vertical axis;

linkage means interconnecting said actuating arm mounting means and said cam shaft, said linkage means translating rotational movement of said actuating arm to said cam shaft; and said contacts are parallel to said support and, hence, perpendicular to said vertical axes.

6. An assembly as set forth in claim 5 wherein:

said positive latch means is carried by said actuating arm mounting means.

7. An assembly as set forth in claim 6 wherein:

said box has a bracket thereon including a slotted plate disposed below the bottom of said box; and said latch means extends into said slotted plate.

8. An electronic packaging assembly comprising:

a generally flat stationary support having a front and a rear;

a box for containing electronic components slidable on the upper surface of said support from said front, said box having a front and a rear;

a first connector member fixedly mounted to the rear of said box;

a second connector member fixedly mounted at said rear of said support positioned to mate with said first connector member when said box is slid to the rear of said support;

said first connector member having a first set of contacts secured in individual openings therein, each contact of said first set of contacts having a contacting surface;

said second connector member having a second set of contacts secured in individual openings therein, each contact of said second set of contacts having a contacting surface;

the contacting surfaces of the contacts of one of said sets of contacts extending outwardly from the openings in their respective connector member in the direction toward the other connector member;

each of said contacts of said second set of contacts being associated with a contact of said first set of contacts and being spaced from said associated contact when said connector members are mated; and means including an actuating arm at said front of said support for moving the contacts in said second connector member in tandem causing said contacting surfaces of said first and second sets of contacts to engage after said first connector member is mated with said second connector member, said means including positive latch means cooperating with said box to prevent lifting of said front of said box off of said surface and second latch means, other than said contacts, latching said first and second connector members together to prevent lifting of said rear of said box off of said support surface, shifting of said actuating arm simultaneously engaging said contacts of said first and second connector members and operating said positive latch means and said second latch means.

9. An electronic packaging assembly comprising:

a generally flat stationary support having a front and a rear;

a box for containing electronic components slidable on the upper surface of said support from said front, said box having a front and a rear;

a first connector member fixedly mounted to the rear of said box;

a second connector member fixedly mounted at said rear of said support positioned to mate with said first connector member when said box is slid to the rear of said support;

said first connector member having a first set of contacts secured in individual openings therein, each contact of said first set of contacts having a contacting surface;

said second connector member having a second set of contacts secured in individual openings therein, each contact of said second set of contacts having a contacting surface;

the contacting surfaces of the contacts of one of said sets of contacts extending outwardly from the openings in their respective connector member in the direction toward the other connector member;

each of said contacts of said second set of contacts being associated with a contact of said first set of contacts and being spaced from said associated contact when said connector members are mated;

means including an actuating arm at said front of said support for moving the contacts in said second connector member in tandem causing said contacting surfaces of said first and second sets of contacts to engage after said first connector member is mated with said second connector member, said means including positive latch means cooperating with said box to prevent lifting of said front of said box off of said surface and second latch means, other than said contacts, latching said first and second connector members together to prevent lifting of said rear of said box off of said support surface; and said contact moving means including an insulator plate slidably mounted in said second connector member, a vertically disposed rotatable cam shaft operatively engageable with said plate, rotation of said shaft bringing said contacts of said first and second connector members into engagement, said contacts being parallel to said support, and hence, perpendicular to said cam shaft, said actuating arm being movable between first and second positions, movement of said arm from said first to second position causing said shaft to rotate.

10. An assembly as set forth in claim 9 wherein said contact moving means further includes:

a member mounted for rotation about a vertically disposed axis at said front of said support;

said arm being fixed to said member; and means for translating rotational movement from said member to said cam shaft.

11. An assembly as set forth in claim 10 wherein said rotational movement translating means includes:

a bell crank fixed to each said shaft and said member below said support; and links below said support connecting the respective ends of said bell cranks.

12. An assembly as set forth in claim 10 wherein:

said positive latch means is carried by said member; and said second latch means is carried by said cam shaft.

13. An assembly as set forth in claim 12 wherein:

said positive latch means is fixed relative to said arm.

14. An assembly as set forth in claim 10 wherein:

said member comprises a vertically disposed bushing having an annular groove therein between its upper and lower ends defining upper and lower parts separated by a neck, said upper part being elongated with its longer axis lying in a path perpendicular to said support front and rear when said arm is in said first position;

a horizontally disposed plate fixed to said front of said box below the bottom of said box;

a slot in said plate opening to the rear thereof vertically positioned and dimensioned to slidably receive said neck; and the length of said upper part of said bushing being greater than the width of said slot whereby rotation of said arm to said second position causes the ends of said upper part of said bushing to overlie said plate.

15. An assembly as set forth in claim 14 wherein:

said plate includes a rear vertically disposed section having a second slot therein aligned with said first-mentioned slot and having a width less than the length of said bushing upper part but greater than the width of said upper part whereby said vertically disposed section of said plate cannot advance forwardly beyond said bushing to engage said two sets of contacts when said arm is in said second position.

* * * * *